US012482632B2

(12) United States Patent
Hasegawa et al.

(10) Patent No.: US 12,482,632 B2
(45) Date of Patent: Nov. 25, 2025

(54) HIGH-FREQUENCY POWER SUPPLY APPARATUS

(71) Applicant: DAIHEN Corporation, Osaka (JP)

(72) Inventors: Yuichi Hasegawa, Osaka (JP); Yuya Ueno, Osaka (JP)

(73) Assignee: DAIHEN Corporation, Osaka (JP)

( * ) Notice: Subject to any disclaimer, the term of this patent is extended or adjusted under 35 U.S.C. 154(b) by 103 days.

(21) Appl. No.: 18/396,280

(22) Filed: Dec. 26, 2023

(65) Prior Publication Data

US 2024/0222077 A1 Jul. 4, 2024

(30) Foreign Application Priority Data

Dec. 28, 2022 (JP) ................................ 2022-211567

(51) Int. Cl.
*H01J 37/32* (2006.01)

(52) U.S. Cl.
CPC .. *H01J 37/32155* (2013.01); *H01J 37/32183* (2013.01); *H01J 2237/327* (2013.01)

(58) Field of Classification Search
None
See application file for complete search history.

(56) References Cited

U.S. PATENT DOCUMENTS 10,707,054 B1 7/2020 Kubota
11,972,927 B2 * 4/2024 Van Zyl ............... H03H 7/0138
2017/0062187 A1 3/2017 Radomski et al.
2019/0057845 A1 2/2019 Nagami et al.
2020/0126770 A1 4/2020 Nagami et al.
2020/0219706 A1 7/2020 Koshimizu
2020/0294770 A1 9/2020 Kubota
2022/0028665 A1 1/2022 Nagami et al.
2022/0068604 A1 3/2022 Kubota
2022/0084787 A1 3/2022 Koshimizu et al.
2022/0208519 A1 6/2022 Hasegawa et al.
2022/0238313 A1 7/2022 Koshimizu

FOREIGN PATENT DOCUMENTS

JP 6785862 B2 11/2020
JP 7045152 B2 3/2022
JP 2022-102688 A 7/2022
JP 2022-105037 A 7/2022

* cited by examiner

*Primary Examiner* — Kenneth B Wells
(74) *Attorney, Agent, or Firm* — Rimon P.C.

(57) ABSTRACT

A high-frequency power supply apparatus includes a first power supply, a second power supply, a matching circuit, and a low-pass filter. The first power supply outputs a high-frequency voltage with a first fundamental frequency toward a load. The second power supply outputs, toward the load, a negative polarity voltage with a second fundamental frequency lower than the first fundamental frequency. The matching circuit is connected between the first power supply and the load. The matching circuit matches impedance on a side of the first power supply and impedance on a side of the load. The low-pass filter is connected between the second power supply and the load. The first power supply performs frequency modulation control by: performing frequency-modulation on the high-frequency voltage with a trapezoidal modulation signal whose frequency is equal to the second fundamental frequency, and outputting a modulated wave obtained by the frequency-modulation on the high-frequency voltage.

3 Claims, 7 Drawing Sheets

HIGH-FREQUENCY POWER SUPPLY APPARATUS

CROSS-REFERENCE TO RELATED APPLICATIONS

This application is based upon and claims the benefit of priority from Japanese Patent Application No. 2022-211567, filed on Dec. 28, 2022, the entire contents of which are incorporated herein by reference.

FIELD

The present disclosure relates generally to a high-frequency power supply apparatus.

BACKGROUND

A high-frequency power supply apparatus used for a plasma processing apparatus outputs a voltage toward a load from a power supply (referred to as a first power supply, for convenience) with a higher fundamental frequency and a power supply (as a second power supply) with a lower fundamental frequency.

In such a high-frequency power supply apparatus, intermodulation distortion (IMD) may occur. The relevant art can be found in, for example, patent documents including JP 7045152 B2, JP 2022-105037 A, JP 2022-102688 A, and JP 6785862 B2.

In a case where, for example, the first power supply and the second power supply each generate a sinusoidal high-frequency voltage, reflected wave power caused by the IMD can be reduced by performing frequency modulation on the sinusoidal high-frequency voltage of the first power supply with a sinusoidal modulation signal corresponding to the high-frequency voltage of the second power supply.

On the other hand, in a case where the first power supply generates a sinusoidal high-frequency voltage and the second power supply generates a rectangular negative-polarity voltage, it tends to be difficult to reduce the reflected wave power caused by the IMD even if performing the frequency modulation control on the sinusoidal high-frequency voltage of the first power supply with a rectangular modulation signal corresponding to the negative polarity voltage of the second power supply.

SUMMARY

A high-frequency power supply apparatus according to the present disclosure includes a first power supply, a second power supply, a matching circuit, and a low-pass filter. The first power supply is configured to output a high-frequency voltage with a first fundamental frequency toward a load. The second power supply is configured to output, toward the load, a negative polarity voltage with a second fundamental frequency being lower than the first fundamental frequency. The matching circuit is connected between the first power supply and the load. The matching circuit is configured to match impedance on a side of the first power supply and impedance on a side of the load. The low-pass filter is connected between the second power supply and the load. The first power supply is configured to perform frequency modulation control by: performing frequency-modulation on the high-frequency voltage with a trapezoidal modulation signal whose frequency is equal to the second fundamental frequency, and outputting a modulated wave obtained by the frequency-modulation on the high-frequency voltage.

DETAILED DESCRIPTION

Hereinafter, an embodiment of a high-frequency power supply apparatus according to the present disclosure will be described with reference to the drawings.

Embodiment

The high-frequency power supply apparatus according to the embodiment is used for a plasma processing apparatus. The high-frequency power supply apparatus outputs, toward a load, a voltage from each of a power supply (first power supply) with a higher fundamental frequency and a power supply (second power supply) with a lower fundamental frequency. In the high-frequency power supply apparatus, intermodulation distortion (IMD) corresponding to the frequency of the second power supply is generated in the high-frequency voltage output from the first power supply.

In a case where the first power supply generates a sinusoidal high-frequency voltage and the second power supply generates a rectangular negative-polarity voltage, the reflection power of the first power supply varies with a waveform of the rectangular negative-polarity voltage due to the IMD. Even if the frequency modulation control is performed on the sinusoidal high-frequency voltage of the first power supply with a rectangular modulation signal corresponding to the negative polarity voltage of the second power supply, it tends to be difficult to reduce the reflected wave power caused by the IMD.

In the present embodiment, the reflected wave power caused by the IMD is reduced by the first power supply performing frequency modulation control by performing frequency-modulation on a high-frequency voltage with a trapezoidal modulation signal whose frequency is equal to a second fundamental frequency and then outputting a modulated wave obtained by the frequency-modulation on the high-frequency voltage.

Figure 1:
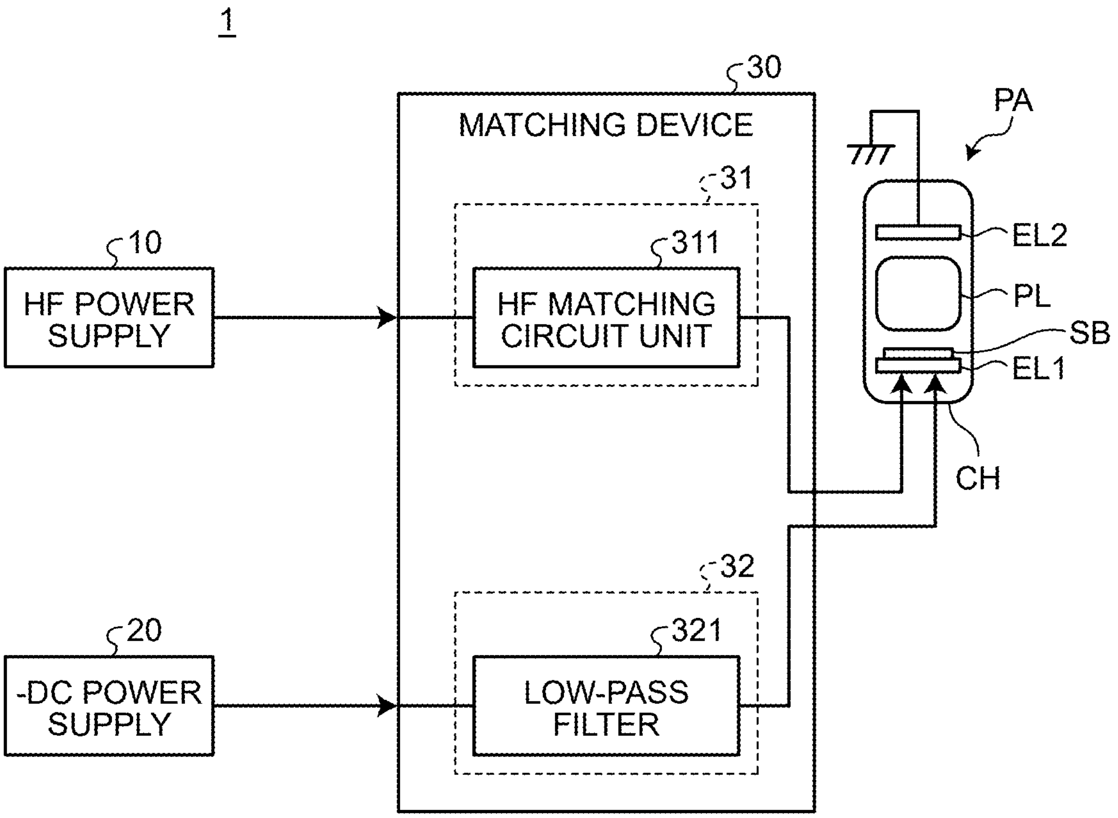
FIG. 1 is a block diagram illustrating a configuration of a high-frequency power supply apparatus according to an embodiment.

FIG. 1 is a block diagram illustrating a configuration of high-frequency power supply apparatus 1. The high-frequency power supply apparatus 1 is applied to a plasma processing apparatus PA. The plasma processing apparatus PA is, for example, a parallel plate type, and a lower electrode EL1 and an upper electrode EL2 face each other in a chamber CH. A substrate SB to be processed can be placed on the lower electrode EL1. The high-frequency power supply apparatus 1 is electrically connected to the lower electrode EL1. The upper electrode EL2 is electrically connected to the ground potential. The chamber CH is connected to a gas supply device (not illustrated) via an air supply pipe, and is connected to a vacuum device (not illustrated) via an exhaust pipe.

The high-frequency power supply apparatus 1 includes an HF power supply 10 (an example of the first power supply), a −DC (minus DC) power supply 20 (an example of the second power supply), and a matching device 30. The HF power supply 10 generates a high-frequency voltage with a first fundamental frequency F1 in response to a command signal from a host controller (not illustrated). The HF power supply 10 supplies high-frequency power (traveling wave power) to the load by outputting the high-frequency voltage (traveling wave voltage). The high-frequency voltage mainly has the first fundamental frequency F1 that is relatively high and suitable for generating plasma PL. The first fundamental frequency F1 is, for example, 40.68 MHz. The HF power supply 10 is also referred to as a source power supply. Note that the fundamental frequency F1 is not limited to 40.68 MHZ, and may be, for example, a frequency of an industrial RF band (Radio Frequency) such as 13.56 MHz or 27.12 MHz.

The −DC power supply 20 generates a negative polarity voltage in response to a command signal from a host controller (not illustrated). The negative polarity voltage may be in a form of a rectangular wave. The −DC power supply 20 supplies a negative polarity voltage to the load. The negative polarity voltage has a second fundamental frequency F2 that is relatively low and is suitable for ion acceleration. The second fundamental frequency F2 is lower than the first fundamental frequency F1 and is, for example, 400 KHz.

Figure 2:
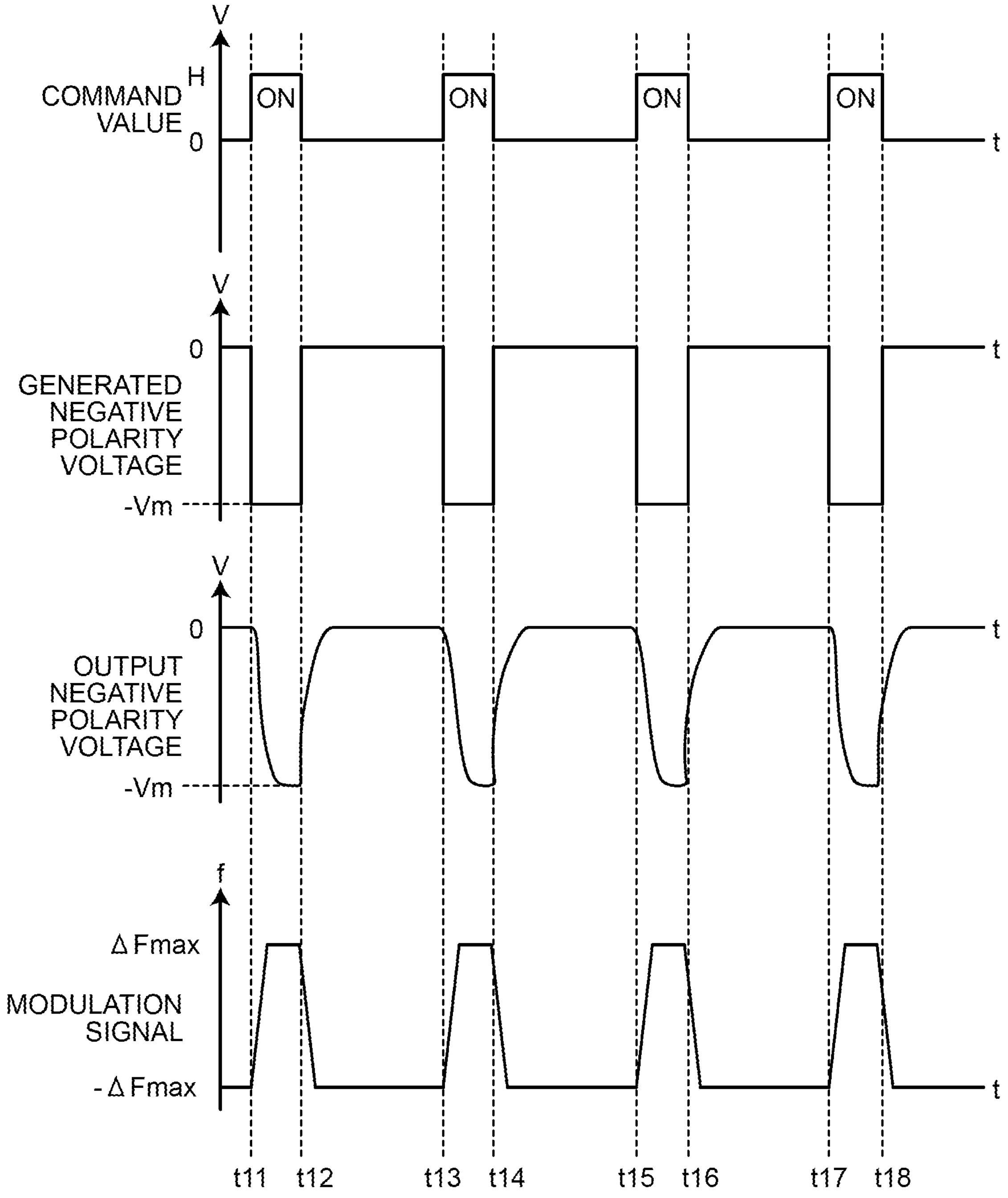
FIG. 2 is a waveform diagram illustrating a negative polarity voltage and a modulation signal in the embodiment.

When, for example, the command value changes from zero to H level at a timing t11 illustrated in FIG. 2, the −DC power supply 20 causes the level of the negative polarity voltage to transition from zero to a negative potential −Vm. At this time, the −DC power supply 20 generates the negative polarity voltage so as to transition to a rectangular wave, whereas the output negative polarity voltage transitions with a time constant delay due to the influence of the load. The −DC power supply 20 generates the negative polarity voltage so as to maintain the level of the negative polarity voltage at the negative potential −Vm until a timing t12.

When the command value becomes zero from the H level at the timing t12, the −DC power supply 20 causes the level of the negative polarity voltage to transition from the negative potential −Vm to zero. At this time, the −DC power supply 20 generates the negative polarity voltage so as to transition to a rectangular wave, whereas the output negative polarity voltage transitions with a time constant delay due to the influence of the load. The −DC power supply 20 maintains the level of the negative polarity voltage at zero until a timing t13.

Operations similar to those at the timings t11 to t13 are repeated at timings t13 to t15 and timings t15 to t17. The length of time between the timings t11 and t13, which is a repetition period, corresponds to the second fundamental frequency F2.

Note that the second fundamental frequency F2 is not limited to 400 kHz, and may be another frequency.

The matching device 30 illustrated in FIG. 1 is electrically connected to the HF power supply 10 and the −DC power supply 20. The matching device 30 includes a matching unit 31 and a filter unit 32. The matching unit 31 is electrically connected between the HF power supply 10 and the lower electrode EL1. The matching unit 31 includes an HF matching circuit unit 311. The matching unit 31 is capable of changing the impedance of the HF matching circuit unit 311 to match the impedance on the HF power supply 10 side and the impedance on the load side. The filter unit 32 is electrically connected between the −DC power supply 20 and the lower electrode EL1. The filter unit 32 includes a low-pass filter 321. The filter unit 32 is configured to smooth the negative polarity voltage from the −DC power supply 20 by causing the negative polarity voltage to pass through the low-pass filter 321. In a state where the HF matching operation is performed by the matching unit 31, the matching device 30 receives high-frequency power from the HF power supply 10 and supplies the high-frequency power to the lower electrode EL1 via the matching unit 31. At the same time, the matching device 30 receives the negative polarity voltage from the −DC power supply 20 and supplies the negative polarity voltage to the lower electrode EL1 via the filter unit 32.

Note that the high-frequency power supply apparatus 1 and the plasma processing apparatus PA are not limited to the configuration illustrated in FIG. 1. There may be various configurations including, for example, a configuration that the high-frequency power output from the HF power supply 10 is supplied to the upper electrode EL2 via the matching device 30, and the power corresponding to the negative polarity voltage output from the −DC power supply 20 is supplied to the lower electrode EL1 via the matching device 30. The high-frequency power supply apparatus 1 can be used for the various configurations.

The HF power supply 10 performs frequency modulation control by performing frequency-modulation on the high-frequency voltage with a trapezoidal modulation signal (see FIG. 2) whose frequency is equal to the second fundamental frequency F2 and then outputting a modulated wave obtained by the frequency-modulation on the high-frequency voltage. The impedance of the IMD may fluctuate in the form of a rectangular wave in accordance with the rectangular negative-polarity voltage generated by the −DC power supply 20. The modulation signal used when the HF power supply 10 performs the frequency modulation control is in the form of a trapezoidal wave. By forming the modulated wave as a trapezoidal modulation signal, it is possible to suppress IMD at predetermined timings (for example, the timings t11 and t12 illustrated in FIG. 2) corresponding to the rise and fall of the negative polarity voltage with a relatively large impedance fluctuation. In addition, by using the trapezoidal modulation signal, the speed of frequency transition can be suppressed as compared to the case where the modulation signal is formed as a rectangular wave, and the fluctuation (frequency transient) of the load can be alleviated accordingly.

Figure 3:
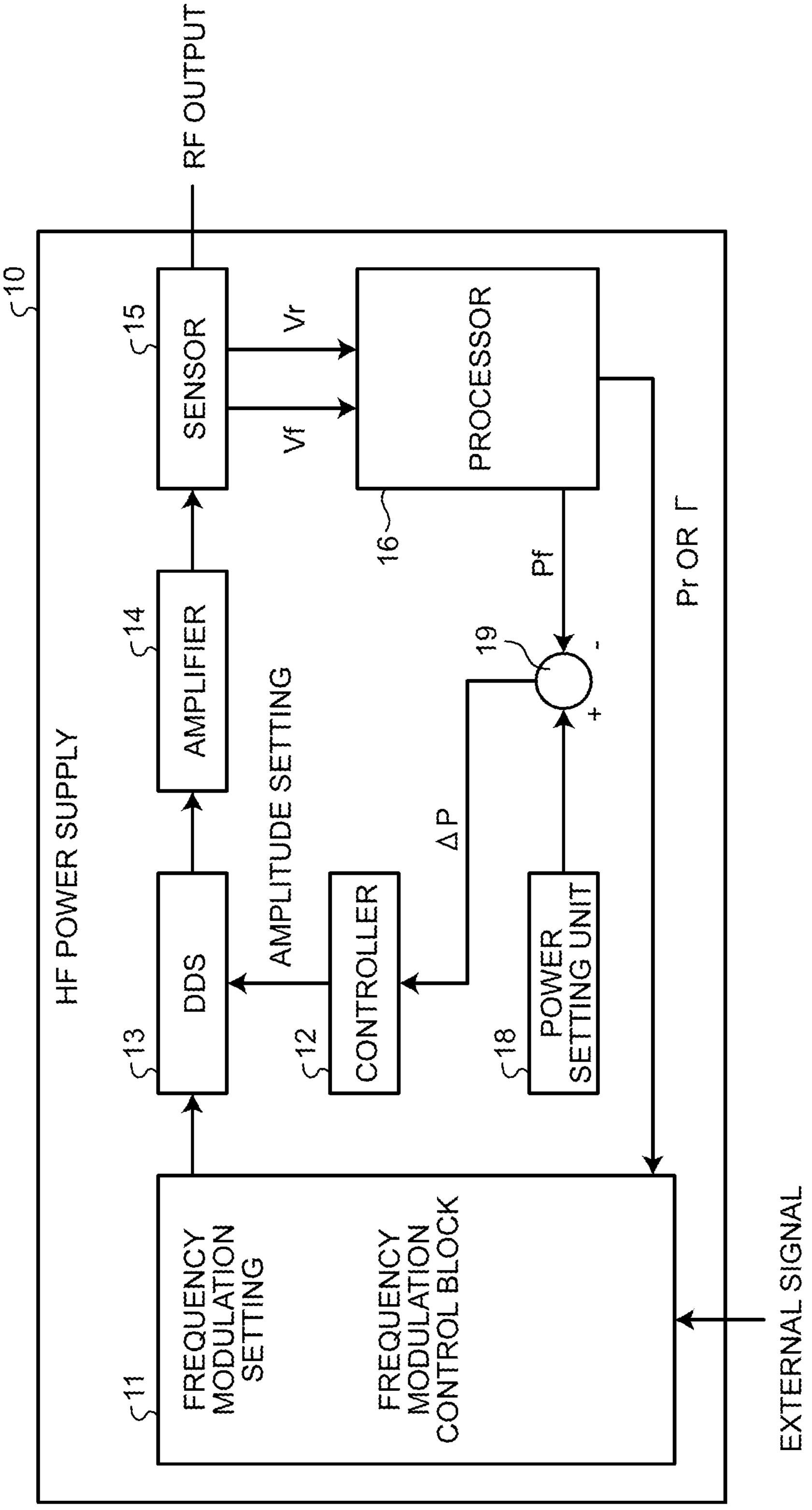
FIG. 3 is a block diagram illustrating a configuration of an HF power supply according to the embodiment.

The HF power supply 10 functions to calculate the magnitude of a reflection coefficient Γ or the magnitude of reflected wave power Pr on the basis of information detected in the HF power supply 10. As illustrated in FIG. 3, the HF power supply 10 includes a frequency modulation control block 11, a controller 12, a direct digital multiplexer (DDS) 13, an amplifier 14, a sensor 15, a processor 16, a power setting unit 18, and a subtractor 19. FIG. 3 is a block diagram illustrating a configuration of the HF power supply 10. The frequency modulation control block 11 generates a modulation fundamental wave. The modulation fundamental wave has the frequency F2 and a reference amplitude. The frequency modulation control block 11 generates the modulation signal by setting a start phase at which modulation is to be started and a frequency shift amount indicating a degree of modulation to the modulation fundamental wave, on the basis of an external signal corresponding to a command value (see FIG. 2). The modulation signal includes the start phase and the frequency shift amount. The frequency modulation control block 11 may generate a trapezoidal modulation signal (see FIG. 2). The frequency modulation control block 11 supplies, to the DDS 13, the modulation signal as frequency modulation setting. The DDS 13 generates a modulated wave whose frequency is equal to the second fundamental frequency F2, by using the frequency modulation setting (that is, the modulation signal) and the amplitude setting. The DDS 13 then supplies the modulated wave to the amplifier 14. The amplifier 14 amplifies the modulated wave and supplies the amplified wave to the sensor 15.

The sensor 15 supplies the modulated wave (traveling wave) output from the amplifier 14 to the matching device 30. The sensor 15 detects a traveling wave voltage from the amplifier 14 and outputs a traveling wave voltage detection signal Vf1 as a detection signal. Additionally, the sensor 15 detects a reflected wave voltage reflected from the plasma processing apparatus PA side via the matching device 30, and outputs a reflected wave voltage detection signal Vr as a detection signal. The sensor 15 supplies the detected traveling wave voltage detection signal Vf and reflected wave voltage detection signal Vr to the processor 16.

The processor 16 performs calculation on the traveling wave voltage detection signal Vf and the reflected wave voltage detection signal Vr by, for example, a super-heterodyne method to perform filtering processing. Thereby, the processor 16 extracts a traveling wave voltage detection signal Vf2, which is a desired component of the traveling wave voltage detection signal Vf1, and a reflected wave voltage detection signal Vr2, which is a desired component of the reflected wave voltage detection signal Vr1.

The processor 16 calculates traveling wave power Pf on the basis of traveling wave voltage detection signal Vf2, and calculates reflected wave power Pr on the basis of reflected wave voltage detection signal Vr2. For example, the traveling wave power Pf can be calculated by Vf2^2/R (R denotes the gain corresponding to resistance value). The reflected wave power Pr can be calculated in a similar manner. Note that, in the above calculation formula, Vf2 represents the magnitude of the traveling wave voltage detection signal Vf2. Of course, the gain for conversion to the actual power value is multiplied.

Moreover, the processor 16 accumulates the calculated traveling wave power Pf and reflected wave power Pr in a predetermined period. The processor 16 averages the traveling wave power Pf and the reflected wave power Pr for the predetermined period. The processor 16 supplies the average power of the traveling wave power Pf to the subtractor 19. The processor 16 also supplies the average power of the traveling wave power Pf and the average power of the reflected wave power Pr to the frequency modulation control block 11. Note that, in the above description, the example in which the averaging is performed after the power is calculated on the basis of the voltage has been described, whereas the power may be calculated after the voltage has been averaged.

Target power is preset for the power setting unit 18. The power setting unit 18 supplies the target power to the subtractor 19. The subtractor 19 subtracts the average power of the traveling wave power Pf from the target power, and feeds back a subtraction result as an error ΔP to the controller 12. The controller 12 controls the amplitude of the modulated wave in accordance with the error ΔP. Specifically, for example, the controller 12 obtains the amplitude of the modulated wave so as to decrease the error ΔP, and then supplies, to the DDS 13, the amplitude setting corresponding to the obtained amplitude.

In a case where, for example, the target power is 1,000 W and the average power of the traveling wave power Pf is 950 W, 50 W is short of the target power. In this case, the controller 12 controls the amplitude of the modulated wave so as to increase the traveling wave power Pf to be supplied to the load. A known method such as PI control or PID control can be used for controlling the amplitude of the modulated wave.

In this way, the frequency modulation control block 11 adjusts the start phase of the modulation signal and the frequency shift amount of the modulated wave within respective predetermined adjustment ranges so as to minimize the average power of the reflected wave power Pr. In one example, at the time when the average power of the reflected wave power Pr becomes equal to or less than a predetermined threshold, the frequency modulation control block 11 recognizes that the average power of the reflected wave power Pr becomes minimum. The frequency modulation control block 11 may make a determination that the frequency modulation control has been completed when the average power of the reflected wave power Pr becomes minimum.

Figure 4:
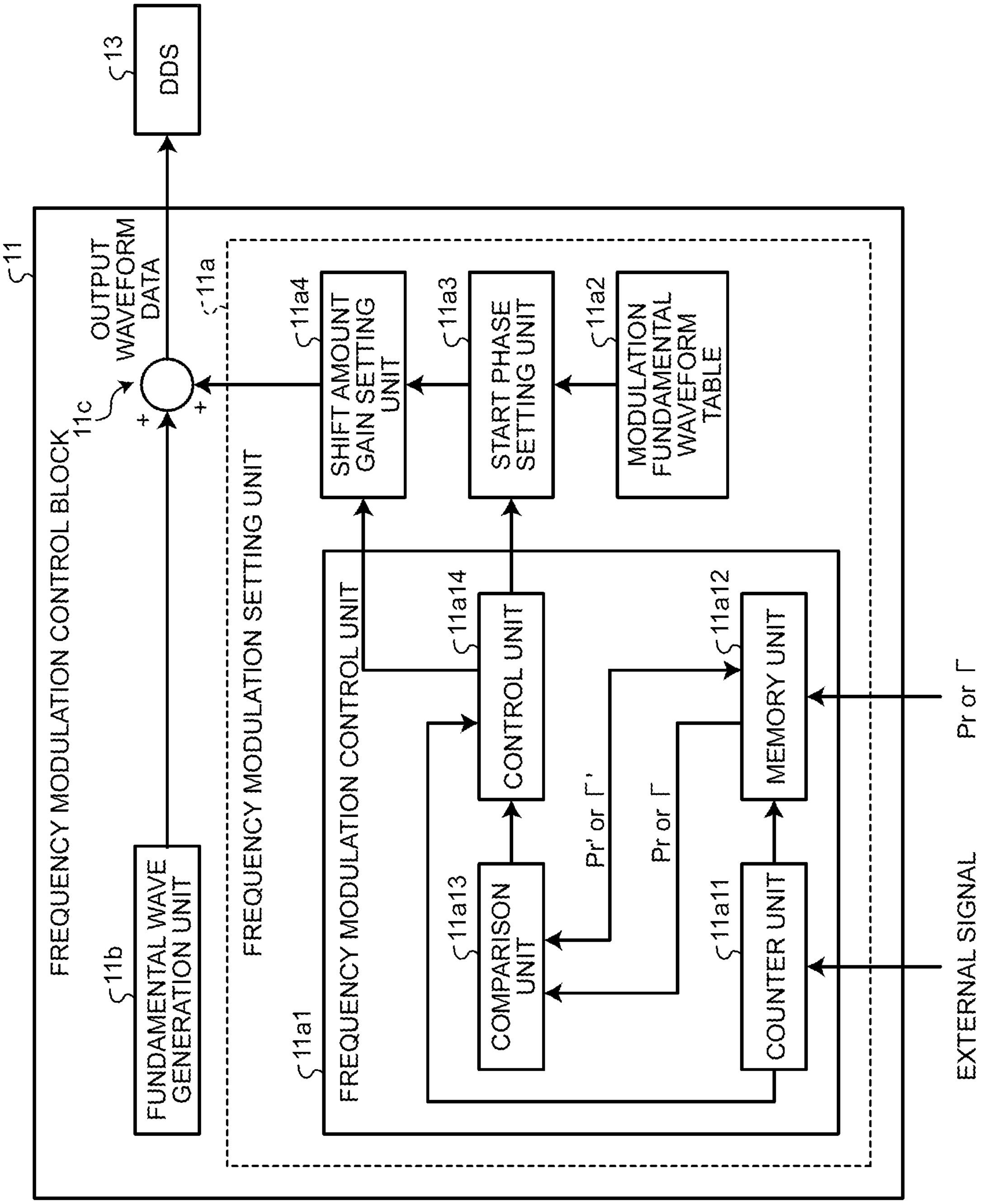
FIG. 4 is a block diagram illustrating a configuration of a frequency modulation control block according to the embodiment.

FIG. 4 is a block diagram illustrating a configuration of the frequency modulation control block 11. As illustrated in FIG. 4, the frequency modulation control block 11 includes a frequency modulation setting unit 11*a*, a fundamental wave generation unit 11*b*, and an adder 11*c*. The frequency modulation setting unit 11*a* includes a frequency modulation control unit 11*a*1, a modulation fundamental waveform table 11*a*2, a start phase setting unit 11*a*3, and a shift amount gain setting unit 11*a*4. The frequency modulation control unit 11*a*1 includes a counter unit 11*a*11, a memory unit 11*a*12, a comparison unit 11*a*13, and a control unit 11*a*14.

The fundamental wave generation unit 11*b* generates a signal (typically known as a carrier wave) including frequency information (for example, 40.68 MHz), which is obtained before frequency modulation, and outputs the signal to the DDS 13 through the adder 11*c*. When the output signal from the frequency modulation setting unit 11*a* indicates zero, the fundamental wave generation unit 11*b* outputs the fundamental wave.

In the frequency modulation setting unit 11*a*, the frequency modulation control unit 11*a*1 can generate a timing signal in accordance with a control cycle.

In the modulation fundamental waveform table 11*a*2, amplitude information for one cycle of the second fundamental frequency F2 (for example, 400 kHz) is stored at every predetermined phase interval. In the present disclosure, waveform data represented by this amplitude information for one cycle is referred to as a "modulation fundamental waveform". The modulation fundamental waveform may be in a form of a trapezoidal wave (see FIG. 2).

The phase interval of the amplitude information in the modulation fundamental waveform varies with the control cycle of the frequency modulation control unit 11*a*1. For example, in a case where the frequency modulation control unit 11*a*1 operates at a control cycle of 100 MHz, the frequency modulation control unit is divided into 250 (100 MHz/400 kHz). In this case, the amplitude information for every phase interval of 1.44 degrees (360/250) is stored in the modulation fundamental waveform table 11*a*2. In a case where the frequency modulation control unit 11*a*1 operates at a control cycle of 500 MHz, the frequency modulation control unit is divided into 1250 (500 MHz/400 kHz). In this case, the amplitude information for every phase interval of 0.288 degrees (360/1250) is stored in the modulation fundamental waveform table 11*a*2. The control cycle is set on the basis of a clock signal output from a fundamental clock oscillator (not illustrated).

The amplitude of the modulation fundamental waveform stored in the modulation fundamental waveform table 11*a*2 is a predetermined reference amplitude (for example, the magnitude of the amplitude is +1). Note that the waveform data of the modulation fundamental waveform can be stored in advance in the modulation fundamental waveform table 11*a*2 via the frequency modulation control unit 11*a*1.

The start phase setting unit 11*a*3 reads the modulation fundamental waveform from the modulation fundamental waveform table 11*a*2 in response to the timing signal supplied from the frequency modulation control unit 11*a*1. Thereafter, the start phase setting unit 11*a*3 sets a start phase θst at which modulation in the modulation fundamental waveform is to be started. The method of determining the start phase will be described later. Thereafter, the start phase setting unit 11*a*3 shifts the modulation fundamental waveform in the time direction such that the waveform is started from the start phase θst. For example, in the case of FIG. 2, the start phase setting unit 11*a*3 shifts the modulation fundamental waveform in the time direction such that the waveform is started from each of the falling timings t11, t13, t15, and t17 of the negative polarity voltage. The shifted modulation fundamental waveform is supplied to the shift amount gain setting unit 11*a*4 illustrated in FIG. 4.

The shift amount gain setting unit 11*a*4 sets the frequency shift amount ΔF in response to the timing signal supplied by the frequency modulation control unit 11*a*1. The frequency shift amount ΔF may vary within a range of −ΔFmax to +ΔFmax. For example, ΔFmax is 1.2 MHz. The method of determining the frequency shift amount ΔF will be described later. The frequency shift amount when the fundamental wave signal of the first fundamental frequency F1 output from the fundamental wave generation unit 11*b* is frequency-modulated is represented by the amplitude of the modulation fundamental waveform. By multiplying the modulation fundamental waveform by a gain (shift amount gain) corresponding to the frequency shift amount ΔF, the amplitude of the modulation fundamental waveform is changed, and the frequency shift amount ΔF can be set. The frequency shift amount ΔF and the shift amount gain correspond to each other on a one-to-one basis. Setting of the shift amount gain is equivalent to setting of the frequency shift amount ΔF.

In the frequency modulation control unit 11*a*1, the counter unit 11*a*11 counts the number of pulses of the external signal (see FIG. 5) and supplies the count value to the memory unit 11*a*12 and the control unit 11*a*14. The current reflection power Pr or the reflection coefficient Γ from the processor 16 illustrated in FIG. 3 is stored in the memory unit 11*a*12 illustrated in FIG. 4. The current reflection power Pr or the reflection coefficient Γ and a past reflection power Pr' or the reflection coefficient Γ ' are supplied from the memory unit 11*a*12 to the comparison unit 11*a*13. The timing of storing in the memory unit 11*a*12 may be timing at which the count value of the counter unit 11*a*11 exceeds a given threshold. The comparison unit 11*a*13 compares the past reflection power Pr' with the current reflection power Pr. Alternatively, the comparison unit 11*a*13 compares the past reflection coefficient Γ' with the current reflection coefficient Γ. The comparison unit 11*a*13 supplies the comparison result to the control unit 11*a*14. The control unit 11*a*14 generates a timing signal in accordance with the count value of the counter unit 11*a*11 and the comparison result of the comparison unit 11*a*13, and supplies the timing signal to each of the start phase setting unit 11*a*3 and the shift amount gain setting unit 11*a*4.

The adder 11*c* receives the fundamental wave signal from the fundamental wave generation unit 11*b*, and receives the modulation signal from the shift amount gain setting unit 11*a*4. The adder 11*c* adds the modulation signal to the fundamental wave signal. The addition result is supplied to the DDS 13 as output waveform data.

Figure 5:
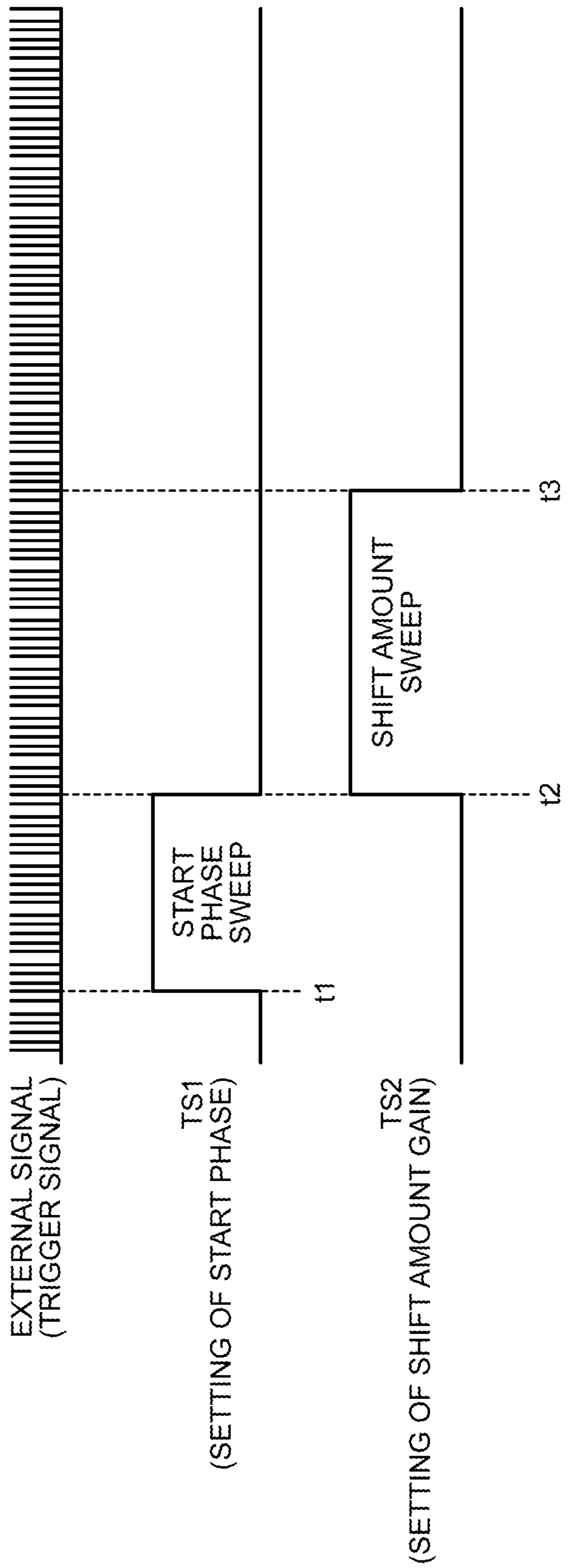
FIG. 5 is a waveform diagram illustrating a timing of search processing according to the embodiment.
Figure 6:
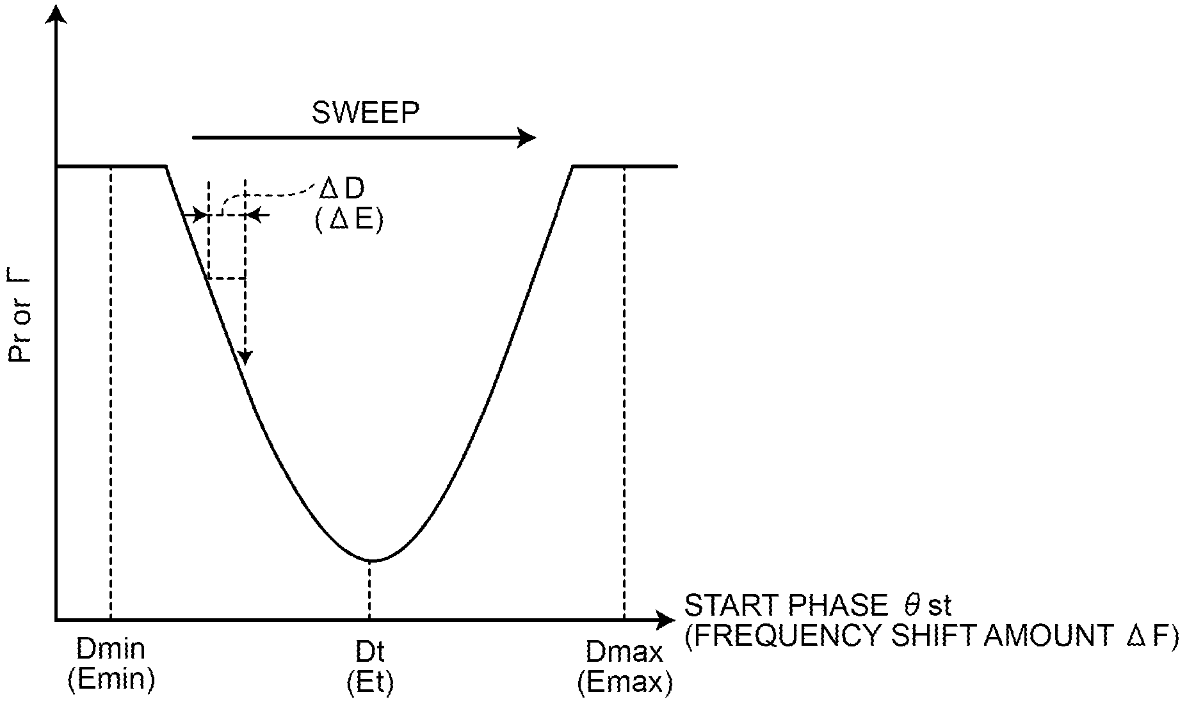
FIG. 6 is a diagram illustrating search processing by a gradient method according to the embodiment.

FIG. 5 is a waveform diagram illustrating the timing of the search processing. As illustrated in FIG. 5, the frequency modulation control block 11 may perform search processing for the start phase θst of the modulation signal and search processing for the frequency shift amount ΔF of the modulated wave in a manner that the magnitude of the reflected wave power Pr or the magnitude of the reflection coefficient Γ decreases. The search processing for the start phase θst of the modulation signal and the search processing for the frequency shift amount ΔF of the modulated wave may be performed by a gradient method as illustrated in FIG. 6. FIG. 6 is a diagram illustrating search processing by the gradient method.

At a timing t1 illustrated in FIG. 5, the frequency modulation control unit 11*al* makes a determination that the setting of the start phase θst should be started by the start phase setting unit 11*a*3. The frequency modulation control unit 11*al* causes the timing signal TS1 to transition from a non-active level to an active level in synchronization with the pulse of the external signal, and supplies the timing signal TS1 to the start phase setting unit 11*a*3. In response to this, the start phase setting unit 11*a*3 starts setting the start phase θst. The start phase setting unit 11*a*3 gradually changes (for example, by control amount ΔD) the start phase θst in synchronization with the pulse of the external signal.

Accordingly, the reflected wave power Pr or the reflection coefficient Γ' from the processor 16 decreases or increases. For example, as illustrated in FIG. 6, when the start phase setting unit 11*a*3 gradually increases the start phase θst from an initial value Dmin, the frequency modulation control unit 11*a*1 recognizes that the reflected wave power Pr or the reflection coefficient Γ starts to decrease. The frequency modulation control unit 11*a*1 observes a change in the reflected wave power Pr or the reflection coefficient Γ at a predetermined control cycle.

The frequency modulation control unit 11*al* recognizes that the change in the reflection power Pr or the reflection coefficient Γ is switched from a decreasing tendency to an increasing tendency. The frequency modulation control unit 11*al* sets the value of the start phase θst at this time, or a value slightly decreased from the value, to a value Dt of the start phase θst at which the reflection power Pr or the reflection coefficient Γ becomes substantially minimum.

At a timing t2 illustrated in FIG. 5, when the value of the start phase θst reaches a maximum value Dmax in the search processing, the frequency modulation control unit 11*al* makes a determination that the start phase setting unit 11*a*3 should end the setting of the start phase θst.

Note that, in a case where the search processing is repeatedly performed, the frequency modulation control unit 11*al* may count the number of repetitions. In this case, when the number of repetitions reaches the maximum number of times in the search processing and the value of the start phase θst reaches the maximum value Dmax in the search processing, the frequency modulation control unit 11*al* makes a determination that the start phase setting unit 11*a*3 should end the setting of the start phase.

The frequency modulation control unit 11*a*1 causes the timing signal TS1 to transition from the active level to the non-active level in synchronization with the pulse of the external signal. In response to this, the start phase setting unit 11*a*3 sets and maintains the value of the start phase θst to Dt, and ends the setting of the start phase θst.

At the same time, the frequency modulation control unit 11*al* makes a determination that the shift amount gain setting unit 11*a*4 should start setting the frequency shift amount ΔF. As illustrated in FIG. 5, the shift amount gain setting unit 11*a*4 shifts the timing signal TS2 from the non-active level to the active level in synchronization with the pulse of the external signal, and supplies the timing signal TS2 to the shift amount gain setting unit 11*a*4. In response to this, the shift amount gain setting unit 11*a*4 starts setting the frequency shift amount ΔF. The shift amount gain setting unit 11*a*4 gradually changes (for example, by control amount ΔE) the frequency shift amount ΔF in synchronization with the pulse of the external signal.

Accordingly, the reflected wave power Pr or the reflection coefficient Γ from the processor 16 decreases or increases. For example, as illustrated in FIG. 6, when the shift amount gain setting unit 11*a*4 gradually increases the frequency shift amount ΔF from the initial value Emin, the frequency modulation control unit 11*a*1 recognizes that the reflected wave power Pr or the reflection coefficient Γ starts to decrease. The frequency modulation control unit 11*a*1 observes a change in the reflected wave power Pr or the reflection coefficient Γ at a predetermined control cycle.

The frequency modulation control unit 11*a*1 recognizes that the change in the reflection power Pr or the reflection coefficient Γ is switched from a decreasing tendency to an increasing tendency. The frequency modulation control unit 11*a*1 sets the value of the frequency shift amount ΔF at this time or a value slightly decreased from the value, to a value Et of the frequency shift amount ΔF at which the reflection power Pr or the reflection coefficient Γ becomes substantially minimum.

At a timing t3 illustrated in FIG. 5, when the value of the frequency shift amount ΔF reaches a maximum value Emax in the search processing, the frequency modulation control unit 11*al* makes a determination that the setting of the frequency shift amount ΔF should be ended by the shift amount gain setting unit 11*a*4.

Note that, in a case where the search processing is repeatedly performed, the frequency modulation control unit 11*al* may count the number of repetitions. In this case, when the number of repetitions reaches the maximum number of times in the search processing and the value of the frequency shift amount ΔF reaches the maximum value Emax in the search processing, the frequency modulation control unit 11*al* makes a determination that the shift amount gain setting unit 11*a*4 should end the setting of the frequency shift amount ΔF.

The frequency modulation control unit 11*a*1 causes the timing signal TS2 to transition from the active level to the non-active level in synchronization with the pulse of the external signal. In response to this, the shift amount gain setting unit 11*a*4 sets and maintains the value of the frequency shift amount ΔF to Et, and ends the setting of the frequency shift amount ΔF.

The period between the timings t1 and t2 is a period in which the search processing for the start phase θst of the modulation signal is performed. The search processing for the start phase θst is also called a start phase sweep.

The period between the timings t2 and t3 is a period in which the search processing of the frequency shift amount ΔF of the modulation signal is performed. The search processing for the frequency shift amount ΔF is also called a shift amount sweep.

After the timing t3, the frequency modulation control block 11 starts frequency modulation control. Specifically, the frequency modulation setting unit 11*a* generates a trapezoidal modulation signal (see FIG. 2) and supplies this modulation signal to the adder 11*c*. The adder 11*c* generates output waveform data by adding the modulation signal to the fundamental wave supplied by the fundamental wave generation unit 11*b*, and supplies the output waveform data to the DDS 13. The DDS 13 generates a modulated wave by performing frequency modulation with the trapezoidal modulation signal. The modulated wave is output to the load via the amplifier 14, the sensor 15, and the matching device 30.

As described above, in the HF power supply 10 according to the embodiment, the frequency modulation control is performed. In the frequency modulation control, the high-frequency voltage is frequency-modulated with the trapezoidal modulation signal (see FIG. 2) whose frequency is equal to the second fundamental frequency F2, and a modulated wave obtained by the frequency modulation is output. Therefore, it is possible to suppress the IMD at the timing corresponding to the rise and fall of the negative polarity voltage with a relatively large impedance fluctuation, and it is possible to reduce the reflected wave power caused by the IMD. In addition, by making the modulation signal have a trapezoidal wave, the speed of frequency transition can be suppressed as compared to the case where the modulation signal is formed into a rectangular wave, and the fluctuation (frequency transient) of the load can be alleviated accordingly.

Figure 7:
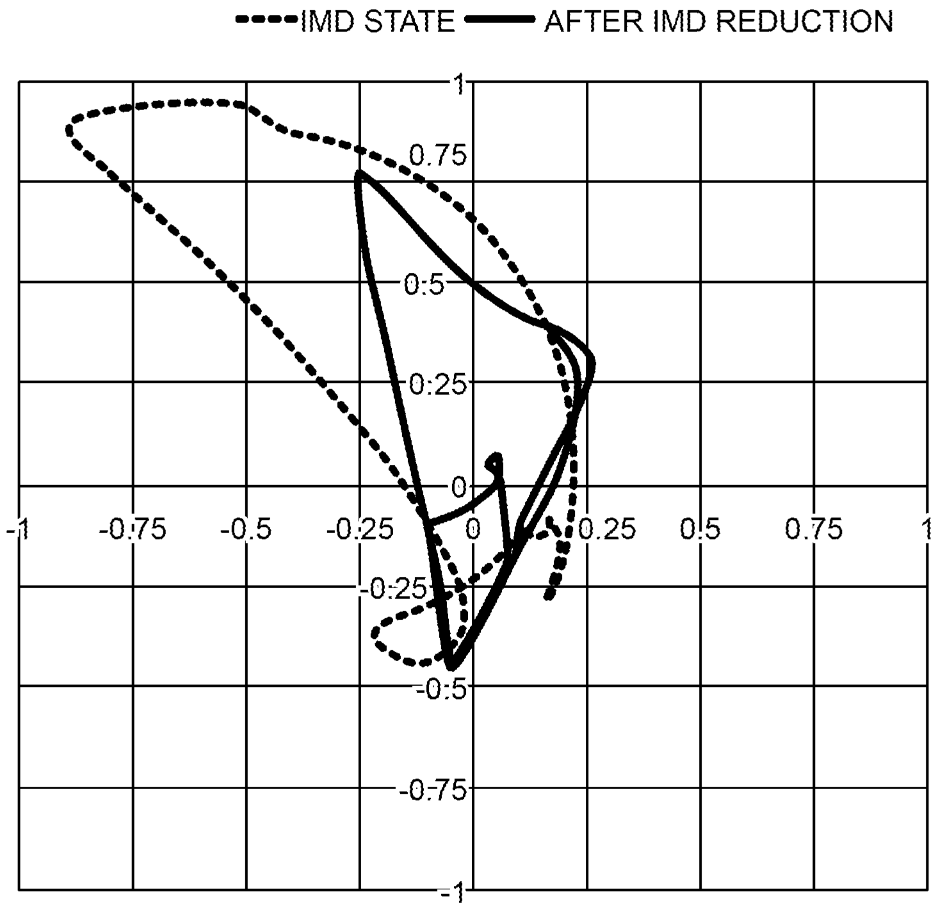
FIG. 7 is a diagram illustrating a trace of impedance during operation of the high-frequency power supply apparatus according to the embodiment.

In a case where, for example, power is supplied from the high-frequency power supply apparatus 1 to a load without performing frequency change control by the HF power supply 10, the impedance of the path from the HF power supply 10 to the load may fluctuate with a large amplitude as indicated by the dotted line in FIG. 7. FIG. 7 is a diagram illustrating a trace of impedance during operation of the high-frequency power supply apparatus. In FIG. 7, the horizontal axis represents the real axis, the vertical axis represents the imaginary axis, and the amplitude of the impedance is indicated by the distance from the origin.

On the other hand, in the HF power supply 10, when power is supplied from the high-frequency power supply apparatus 1 to the load while frequency modulation control is performed by performing frequency modulation on the high-frequency voltage with a trapezoidal modulation signal whose frequency is equal to the second fundamental frequency F2 and outputting a modulated wave obtained by the frequency modulation, the impedance of the path from the HF power supply 10 to the load can fluctuate with a smaller amplitude as indicated by the solid line in FIG. 7. Thus, it is confirmed that the IMD can be effectively suppressed and the reflected wave power caused by the IMD can be reduced.

While certain embodiments have been described, these embodiments have been presented by way of example only, and are not intended to limit the scope of the invention. Indeed, the novel methods and systems described herein may be embodied in a variety of other forms; moreover, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A high-frequency power supply apparatus comprising:

a first power supply configured to i) generate a high-frequency voltage having a first fundamental frequency, ii) perform frequency modulation on the high-frequency voltage using a trapezoid modulation signal, and output a modulated high-frequency voltage toward a load;

a second power supply configured to generate and output, toward the load, a negative polarity voltage having a second fundamental frequency being lower than the first fundamental frequency;

a matching circuit connected between the first power supply and the load, the matching circuit being configured to match an impedance on a side of the first power supply and an impedance on a side of the load; and a low-pass filter connected between the second power supply and the load, wherein the trapezoidal modulation signal has a frequency equal to the second fundamental frequency.

2. The high-frequency power supply apparatus according to claim 1, wherein the first power supply generates the high-frequency voltage with a sinusoidal waveform, and the second power supply generates the negative polarity voltage with a rectangular waveform.

3. The high-frequency power supply apparatus according to claim 1, wherein the first power supply is configured to perform, during the frequency modulation control, search processing for a start phase of the modulation signal and search processing for a frequency shift amount of the modulated wave in a manner that a magnitude of a reflection coefficient or a magnitude of reflected wave power decreases.

* * * * *